(12) United States Patent
Kerr et al.

(10) Patent No.: US 6,303,937 B1
(45) Date of Patent: Oct. 16, 2001

(54) CERAMIC CALIBRATION FILTER

(75) Inventors: Roger S. Kerr, Brockport; Kurt M. Sanger, Rochester, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/031,884

(22) Filed: Feb. 27, 1998

(51) Int. Cl.[7] ........................................................ G01J 1/00
(52) U.S. Cl. .............................. 250/503.1; 250/482.7; 359/888
(58) Field of Search .......................... 385/140; 359/321, 359/885, 308, 339, 498, 893, 894, 888, 601, 613, 614, 558, 350; 347/135; 356/418, 239.2

(56) References Cited

U.S. PATENT DOCUMENTS

| | | |
|---|---|---|
| 4,192,573 | 3/1980 | Brown, Jr. . |
| 4,327,966 | 5/1982 | Bloom . |
| 4,344,172 | 8/1982 | Busse . |
| 4,398,806 | 8/1983 | Bennett et al. . |
| 4,561,721 | 12/1985 | Keilmann et al. . |
| 4,632,512 | 12/1986 | Haerig et al. . |
| 4,711,526 | 12/1987 | Hennings et al. . |
| 4,747,673 | 5/1988 | Marrs et al. . |
| 4,778,263 | 10/1988 | Foltyn . |
| 4,899,348 | 2/1990 | Kiya et al. . |
| 4,925,273 | 5/1990 | Maisenbacher et al. . |
| 4,932,754 | 6/1990 | Haisma et al. . |
| 5,103,454 | 4/1992 | McKee . |
| 5,115,333 | 5/1992 | Mergenthaler et al. . |
| 5,202,794 | 4/1993 | Schnee et al. . |
| 5,266,973 | 11/1993 | Sanger . |
| 5,268,708 | 12/1993 | Harshbarger et al. . |
| 5,517,313 | * 5/1996 | Colvin, Jr. ............................ 356/417 |
| 5,577,137 | 11/1996 | Groger et al. . |
| 5,627,541 | * 5/1997 | Haley et al. .............................. 342/1 |
| 5,739,947 | * 4/1998 | Wood et al. ......................... 359/885 |
| 5,897,803 | * 4/1999 | Zheng et al. ......................... 219/383 |
| 5,953,468 | * 9/1999 | Finnila et al. ....................... 385/140 |
| 6,002,488 | * 12/1999 | Berg et al. ........................... 356/418 |

FOREIGN PATENT DOCUMENTS

| | | |
|---|---|---|
| 2671184 | * 7/1992 | (FR) . |
| 04120188 | * 4/1992 | (JP) . |

OTHER PUBLICATIONS

"Machinable Glass Ceramic: A Useful Optical Material," Applied Optics, vol. 25, No. 11/1, Jun. 1986, p. 1726.

* cited by examiner

Primary Examiner—Teresa M. Arroyo
Assistant Examiner—Sharon Payne
(74) Attorney, Agent, or Firm—Nelson Adrian Blish

(57) ABSTRACT

The present invention is for a ceramic calibration filter, in one embodiment a ceramic attenuator (410), for attenuating radiation between a light source (402) and a sensor (422). A laser signal is reduced by ceramic attenuator (410) to a low-level signal that can be measured the sensor (422).

10 Claims, 5 Drawing Sheets

CERAMIC CALIBRATION FILTER

CROSS-REFERENCE TO RELATED APPLICATIONS

U.S. patent application Ser. No. 08/989,761, filed Dec. 12, 1997 now U.S. Pat. No. 5,909,237, entitled "Exposing Imagesetter Recording Film on a Color-Proofing Apparatus," by Roger S. Kerr and John D. Gentzke; U.S. patent application Ser. No. 08/977,105, filed Nov. 24, 1997 now U.S. Pat. No. 6,043,836, entitled "Vacuum Drum with Countersunk Holes," by Roger S. Kerr, Dean L. Smith and Douglas A. Hons; U.S. patent application Ser. No. 08/914,078, filed Aug. 18, 1997 now U.S. Pat. No. 6,014,162, entitled "Vacuum Imaging Drum with Media Contours," by Roger S. Kerr, Dean L. Smith and Douglas A. Hons; U.S. patent application Ser. No. 08/883,058, filed Jun. 26, 1997 now U.S. Pat. No. 5,964,133, entitled "A Method of Precision Finishing a Vacuum Imaging Drum," by Roger S. Kerr; and U.S. patent application Ser. No. 08/785,101, filed Jan. 21, 1997 now U.S. Pat. No. 6,002,419, entitled "Vacuum Imaging Drum with an Optimized Surface," by Roger S. Kerr, Dean L. Smith and Douglas A. Hons.

FIELD OF THE INVENTION

This invention relates to an image processing apparatus in general, and in particular to a ceramic filter for calibration of imaging lasers.

BACKGROUND OF THE INVENTION

Pre-press color-proofing is a procedure that is used by the printing industry to create representative images of printed material without the high cost and time that is required to actually produce printing plates and set up a high-speed, high volume, printing press to produce an example of the intended image. These examples may require several corrections and be reproduced several times to satisfy customer requirements. The pre-press color-proofing process saves time and money getting to an acceptable finished product prior to producing printing plates.

Once an intended image is approved by the customer, films required for exposing printing plates are generated. These films are produced on a separate apparatus such as an imagesetter and the imagesetter recording film is used to prepare printing plates which are used to print finished copies in high volume.

An example of a commercially available image processing apparatus is shown in commonly assigned U.S. Pat. No. 5,268,708. This image processing apparatus forms an intended image on a sheet of thermal print media in which dye from a sheet of dye donor material is transferred to the thermal print media by applying thermal energy to the dye donor material.

The printhead on the image processing apparatus includes a plurality of lasers diodes which are tied to the printhead and are individually modulated to supply energy to the thermal print media corresponding to an information signal. A plurality of optical fibers are individually coupled to the laser diodes at one end and terminate as a fiber optic array at the other end. The printhead moves relative to the longitudinal axis of the vacuum imaging drum. The dye is transferred to the thermal print media as the radiation is transferred from the laser diodes by the optical fibers to the printhead and thus to the dye donor material. The radiation is converted to thermal energy in the dye donor sheet material.

The level of laser power determines the amount of dye transferred. To assure consistent proof-to-proof dye transfer as well as machine-to-machine consistency, it is important that a given input signal results in a consistent amount of dye transfer. To set this dye transfer to a desired level, the image processing apparatus incorporates sensor circuitry and a calibration feedback control loop for modulating laser output power. To provide a measured signal, the laser is positioned so that it directs a beam of light at a calibration sensor. This calibration sensor measures the power level that it detects and, in turn, provides a corresponding output signal to laser driver control circuitry. Based on the signal level received from the calibration sensor, the laser driver control circuitry adjusts the input signal that drives each laser to modulate the laser output power. The operator of the image processing apparatus can then verify that the desired output levels are produced by measuring density patches from an image produced on the same image processing apparatus.

Although current processing apparatus operation is satisfactory, there are some limitations. For example, the throughput, commonly expressed in number of intended images produced per hour is limited in part by the laser power level. Existing devices, for example, use imaging lasers with 200–250 mW output power. Increasing this power level to 400 mW or higher would allow the lasers to effectively deliver the same output energy in less time. This, in turn, would allow faster drum rotation and faster writing speeds, thereby increasing throughput.

A second limitation with the currently available processing apparatus is the reliability and power range of existing calibration sensor components. In order to measure high-energy laser power using economical components, the calibration sensor requires a reliable filter that attenuates laser radiation to much lower levels. The cost of sensors for measurement at full laser power would be prohibitive for commercial image processing devices. To attenuate the laser signal, existing devices employ relatively high-cost, sensitive components such as coated filters, for example, Inconel 2.5 Neutral Density (ND) lenses. These components have proved to be scratch-sensitive and are limited in their ability to attenuate higher levels of laser power. For example, if multiple diodes are simultaneously turned on at 200–250 mW, the resulting output power can burn through the protective coating, destroying the filter itself as well as the sensor it is designed to protect.

Another limitation with existing methods for laser calibration is that a relatively expensive sensor component, typically a photodiode, must be selected to handle a high input-power signal. Moreover, the sensor chosen must be matched closely to the level of attenuation that can be achieved, constraining sensor availability. Low-cost photodiode sensors are available, but these sensors measure signals at a lower power range than is currently achievable using existing equipment.

Yet another limitation with existing methods for writing laser measurement is the accuracy required for alignment and focus of the imaging laser relative to the sensor component. Each laser must be precisely positioned relative to the attenuating filter and sensor to assure accurate measurement. In an image processing apparatus employing multiple lasers, repeated, precise repositioning of the lens assembly are required for each individual laser during laser power measurement.

Existing methods for laser power measurement include use of an opto-acoustical converter, discussed in U.S. Pat.

No. 4,344,172, and methods for a laser output control feedback loop are described in U.S. Pat. No. 4,899,348. Examples of ceramic materials used as wave guides in optical components are shown in U.S. Pat. No. 5,577,137 and optical diffusers are discussed in "Machinable Glass Ceramic: A Useful Optical Material," Applied Optics, Vol. 25, No. 11/1, June, 1986, p. 1726. Prior art shows ceramic material used for control of laser modulation by varying the ionization state of a ceramic element. See U.S. Pat. No. 4,889,414.

Thus, is seen that there are a number of areas for improvement in calibration systems for lasers used in image processing apparatus. In particular, there is a need for low cost filters capable of withstanding high powered lasers and durable enough for repeated use, and which are relatively insensitive to precise positioning of the laser and sensor.

SUMMARY OF THE INVENTION

It an object of the present invention to provide a low cost, ceramic calibration filter to attenuate a laser beam in a calibration system. It is also an object of the present invention to provide a porous ceramic attenuator to attenuate laser power in a calibration system for an image processing apparatus to overcome the limitations described above.

The present invention is directed at overcoming one or more of the problems set forth above. Briefly summarized, according to one aspect of the present invention, a ceramic calibration filter for attenuating radiation between a light source and a sensor comprises a ceramic attenuator located between the light source and said sensor.

In one embodiment of the invention, an image processing apparatus using thermal print media and dye donor materials for processing an intended image onto the thermal print media incorporates a ceramic calibration filter which attenuates a laser signal power to levels that can be reliably measured using low-cost components. The characteristics of the ceramic calibration filter are such that the amount of attenuation can be adjusted by changing the dimension and composition of a ceramic attenuator.

This invention provides accurate measurement of laser power without expensive components. The variable range of power levels that can be tolerated using this invention allows accurate measurement of higher laser power levels, which in turn allows faster writing speeds and higher throughput. This allows for wider mechanical tolerances than are available with existing implementations, reducing the overall cost of the image processing apparatus.

It is an advantage of the present invention that it attenuates laser radiation from the high-power levels used for imaging, to low-power levels that can be measured using readily available, low-cost photodiodes.

It is an advantage of the present invention it replaces high-cost, sensitive components with low-cost components that do not require special handling or assembly.

It is an advantage of the present invention that it uses an inherently reliable material whose characteristics are suited to withstanding high temperature conditions.

It is an advantage of the present invention that it uses a material that is an electrical insulator as a component enabling it to be mounted adjacent electrical components without requiring separate insulation.

It is an advantage of the present invention that it allows frequent monitoring of laser output power to compensate for laser aging, heat effects, and other variables that may affect laser output power.

It is an advantage of the present invention that it allows laser power measurement without requiring precise tolerances for laser focus and alignment relative to sensor components.

It is an advantage of the present invention that it allows power measurement for each individual laser without the need to reposition the printhead for each individual laser.

DETAILED DESCRIPTION OF THE INVENTION

Figure 1:
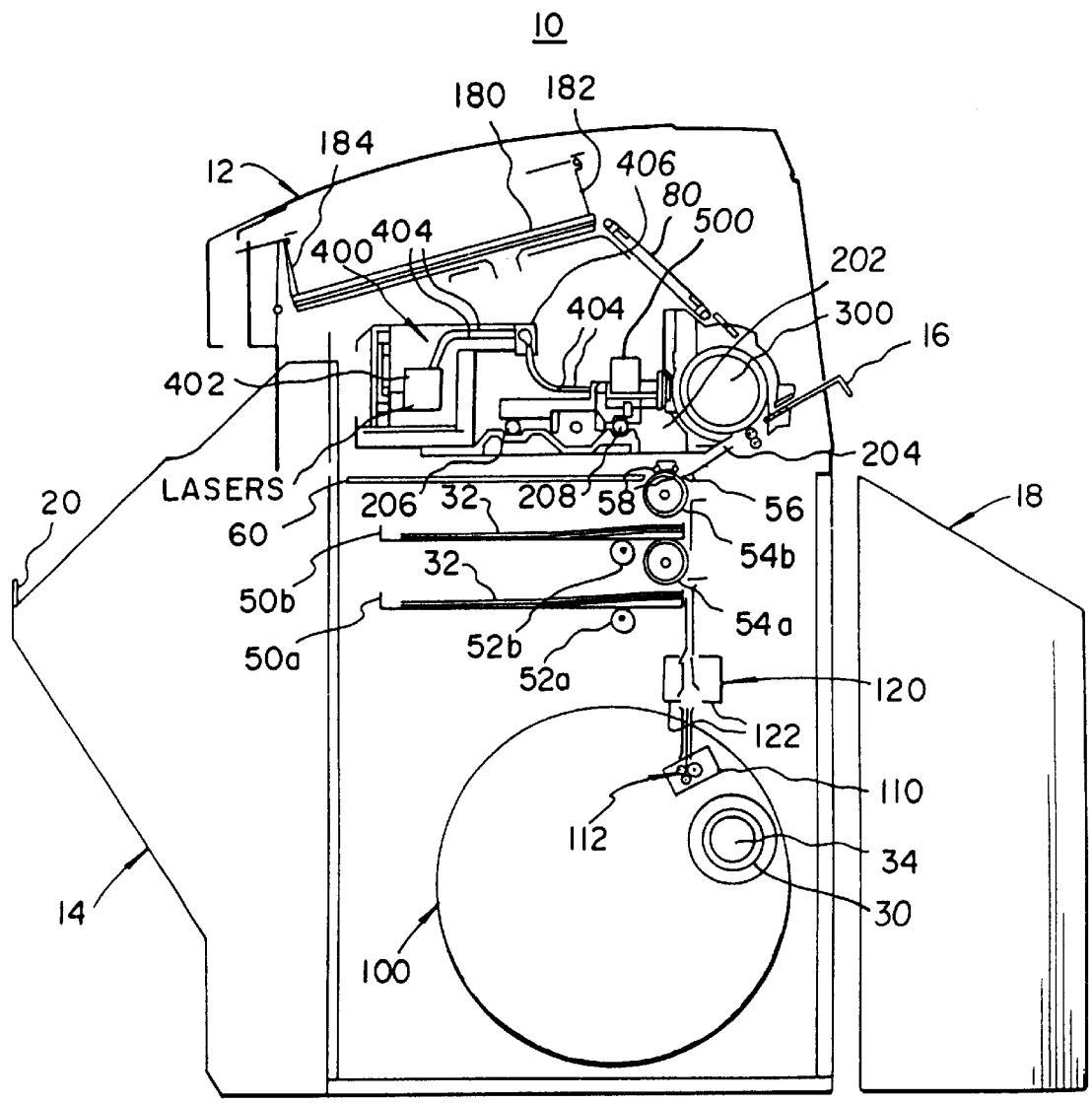
FIG. 1 is a side view in vertical cross-section of an image processing apparatus according to the present invention.

Referring to FIG. 1, there is illustrated an image processing apparatus 10 according to the present invention having an image processor housing 12 which provides a protective cover. A movable, hinged image processor door 14 is attached to the front portion of the image processor housing 12 permitting access to the two sheet material trays, lower sheet material tray 50a and upper sheet material tray 50b, that are positioned in the interior portion of the image processor housing 12 for supporting thermal print media 32, thereon. Only one of the sheet material trays 50 will dispense the thermal print media 32 out of its sheet material tray 50 to create an intended image thereon; the alternate sheet material tray either holds an alternative type of thermal print media 32 or functions as a back up sheet material tray. In this regard, the lower sheet material tray 50a includes a lower media lift cam 52a for lifting the lower sheet material tray 50a and ultimately the thermal print media 32, upwardly toward a rotatable, lower media roller 54a and toward a second rotatable, upper media roller 54b which, when both are rotated, permits the thermal print media 32 to be pulled upwardly towards a media guide 56. The upper sheet material tray 50b includes a upper media lift cam 52b for lifting the upper sheet material tray 50b and ultimately the thermal print media 32 towards the upper media roller 54b which directs it towards the media guide 56.

The movable media guide 56 directs the thermal print media 32 under a pair of media guide rollers 58 which engages the thermal print media 32 for assisting the upper media roller 54b in directing it onto the media staging tray 60. The media guide 56 is attached and hinged to the lathe bed scanning frame 202 at one end, and is uninhibited at its other end for permitting multiple positioning of the media guide 56. The media guide 56 then rotates its uninhibited end downwardly, as illustrated in the position shown, and the direction of rotation of the upper media roller 54b is reversed for moving the thermal print medium receiver sheet material 32 resting on the media staging tray 60 under the pair of media guide rollers 58, upwardly through an entrance passageway 204 and around a rotatable vacuum imaging drum 300.

A roll 30 of dye donor material 34 is connected to the media carousel 100 in a lower portion of the image processor housing 12. Four rolls 30 are used, but only one is shown for clarity. Each roll 30 includes a dye donor material 34 of a different color, typically black, yellow, magenta and cyan. These dye donor materials 34 are ultimately cut into dye donor sheet materials 36 (not shown in FIG. 1) and passed to the vacuum imaging drum 300 for forming the medium from which dyes imbedded therein are passed to the thermal print media 32 resting thereon, which process is described in detail herein below. In this regard, a media drive mechanism 110 is attached to each roll 30 of dye donor material 34, and includes three media drive rollers 112 through which the dye donor material 34 of interest is metered upwardly into a media knife assembly 120. After the dye donor material 34 reaches a predetermined position, the media drive rollers 112 cease driving the dye donor material 34 and the two media knife blades 122 positioned at the bottom portion of the media knife assembly 120 cut the dye donor material 34 into dye donor sheet materials 36. The lower media roller 54b and the upper media roller 54b along with the media guide 56 then pass the dye donor sheet material 36 onto the media staging tray 60 and ultimately to the vacuum imaging drum 300 and in registration with the thermal print media 32 using the same process as described above for passing the thermal print media 32 onto the vacuum imaging drum 300. The dye donor sheet material 36 now rests atop the thermal print media 32 with a narrow gap between the two created by microbeads imbedded in the surface of the thermal print media 32.

A laser assembly 400 includes a quantity of laser diodes 402 in its interior, the lasers 402 are connected via fiber optic cables 404 to a distribution block 406 and ultimately to the printhead 500. The printhead 500 directs thermal energy received from the laser diodes 402 causing the dye donor sheet material 36 to pass the desired color across the gap to the thermal print media 32. The printhead 500 is attached to a lead screw 250, shown in FIG. 2, via the lead screw drive nut 254 and drive coupling 256 (not shown) for permitting movement axially along the longitudinal axis of the vacuum imaging drum 300 for transferring the data to create the intended image onto the thermal print media 32.

During operation, the vacuum imaging drum 300 rotates at a constant velocity, and the printhead 500 begins at one end of the thermal print media 32 and traverse the entire length of the thermal print media 32 for completing the transfer process for the particular dye donor sheet material 36 resting on the thermal print media 32. After the printhead 500 has completed the transfer process, for the particular dye donor sheet material 36 resting on the thermal print media 32 the dye donor sheet material 36 is then removed from the vacuum imaging drum 300 and transferred out the image processor housing 12 via a skive or ejection chute 16. The dye donor sheet material 36 eventually comes to rest in a waste bin 18 for removal by the user. The above described process is repeated for the other three rolls 30 of dye donor materials 34.

Referring again to FIG. 1, after the color from all four sheets of the dye donor sheet materials 36 have been transferred and the dye donor sheet materials 36 have been removed from the vacuum imaging drum 300, the thermal print media 32 is removed from the vacuum imaging drum 300 and transported via a transport mechanism 80 to a color binding assembly 180. The entrance door 182 of the color binding assembly 180 is opened for permitting the thermal print media 32 to enter the color binding assembly 180, and shuts once the thermal print media 32 comes to rest in the color binding assembly 180. The color binding assembly 180 processes the thermal print media 32 for further binding the transferred colors on the thermal print media 32 and for sealing the microbeads thereon. After the color binding process has been completed, the media exit door 184 is opened and the thermal print media 32 with the intended image thereon passes out of the color binding assembly 180 and the image processor housing 12 and comes to rest against a media stop 20.

Figure 2:
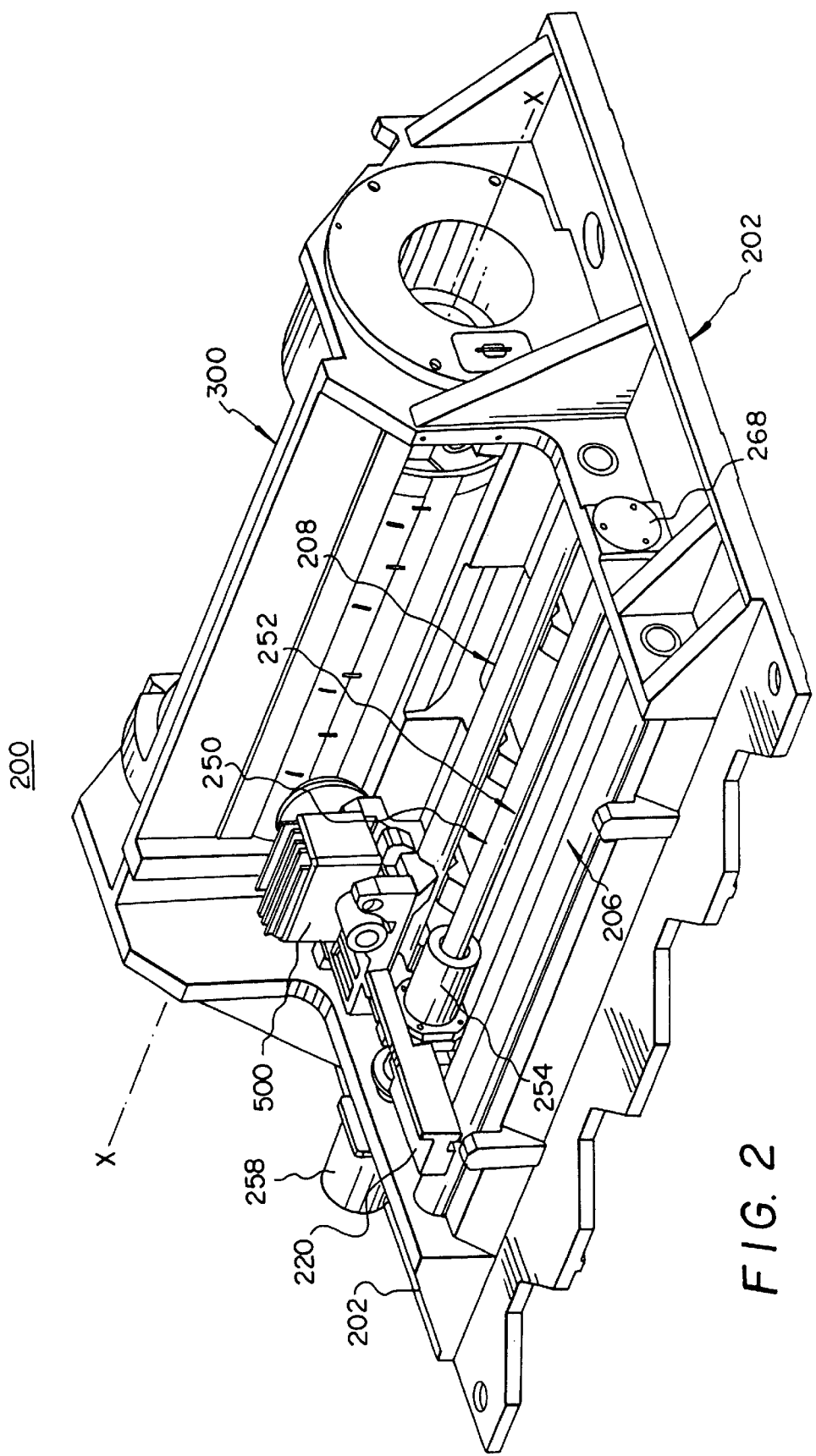
FIG. 2 is a perspective view of the lathe bed scanning subsystem of the present invention.

As shown in FIG. 2, the lathe bed scanning subsystem 200 includes the vacuum imaging drum 300, printhead 500 and lead screw 250, assembled in the lathe bed scanning frame 202. The vacuum imaging drum 300 is mounted for rotation about an axis X in the lathe bed scanning frame 202. The printhead 500 is movable with respect to the vacuum imaging drum 300, and is arranged to direct a beam of light to the dye donor sheet material 36. The beam of light from the printhead 500 for each laser diode 402 is modulated individually by modulated electronic signals from the image processing apparatus 10, which are representative of the shape and color of the original image, so that the color on the dye donor sheet material 36 is heated to cause volatilization only in those areas in which its presence is required on the thermal print media 32 to reconstruct the shape and color of the original image.

The printhead 500 is mounted on a movable translation stage member 220 which, in turn, is supported for low friction slidable movement on translation bearing rods 206 and 208. The translation bearing rods 206 and 208 are sufficiently rigid so that they do not sag or distort between their mounting points and are arranged as parallel as possible with the axis X of the vacuum imaging drum 300 with the axis of the printhead 500 perpendicular to the axis X of the vacuum imaging drum 300 axis. The front translation bearing rod 208 locates the translation stage member 220 in the vertical and the horizontal directions with respect to axis X of the vacuum imaging drum 300. The rear translation bearing rod 206 locates the translation stage member 220 only with respect to rotation of the translation stage member 220 about the front translation bearing rod 208 so that there is no over-constraint condition of the translation stage member 220 which might cause it to bind, chatter, or otherwise impart undesirable vibration or jitters to the printhead 500 during the generation of an intended image.

Figure 3:
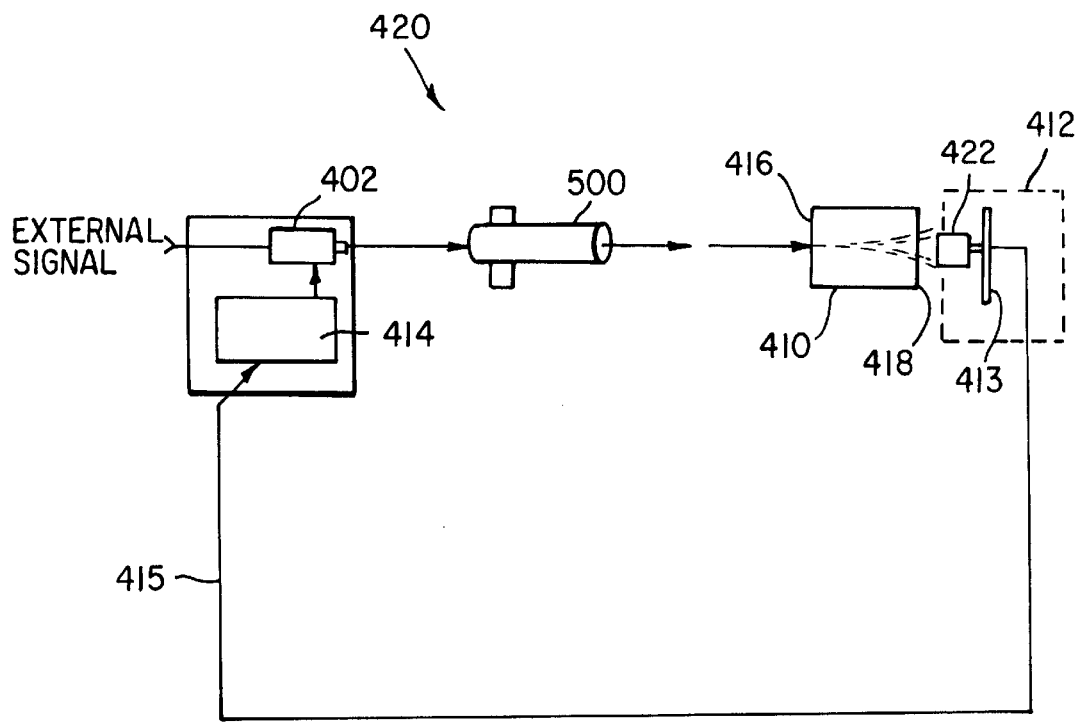
FIG. 3 is a block diagram of a calibration system according to the present invention with a ceramic attenuator.

Referring to FIG. 3, there is illustrated a block diagram of the laser calibration subsystem 420. Each individual laser 402 transmits a signal to the sensing components, one at a time, typically focused by the printhead 500. The ceramic calibration filter in this embodiment comprised of a ceramic attenuator 410, attenuates the amount of light that reaches the calibration sensor 412. Calibration sensor 412 is comprised of a photodiode sensor 422 and a PC board 413 which amplifies the photodiode sensor 422 signal. The feedback signal 415 is transmitted to laser driver control circuitry 414 which sets an input power level for each laser diode 402. Laser diode 402 output power level is controlled by modulating the input power, or current, to the laser diode 402.

Figure 4:
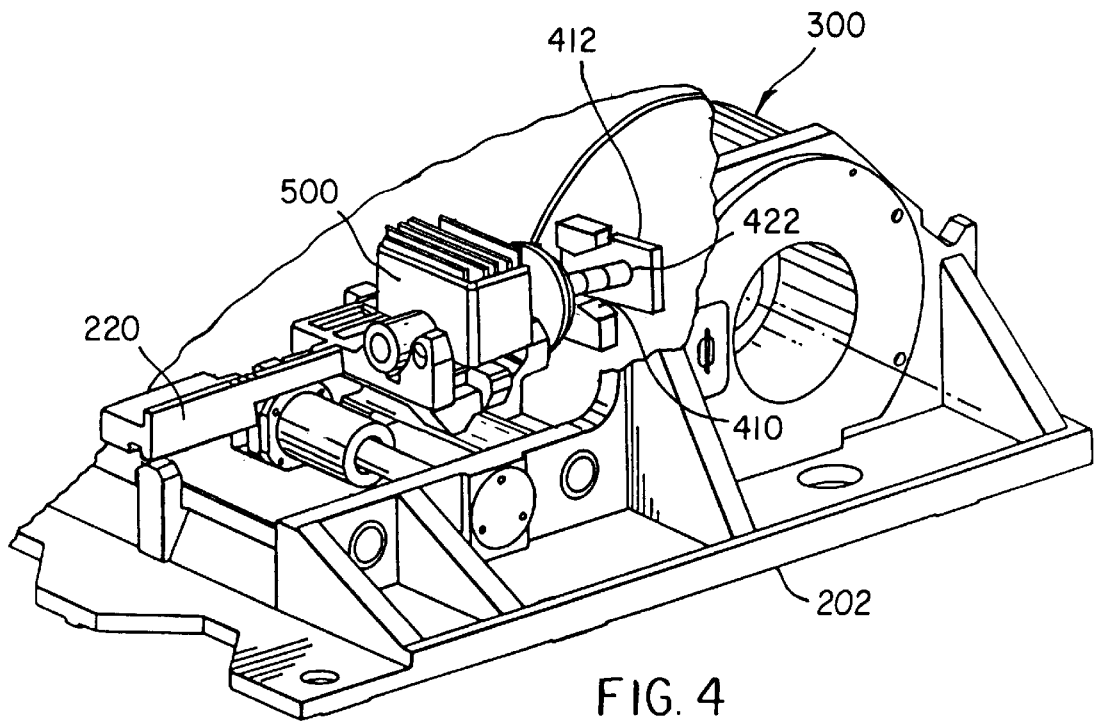
FIG. 4 shows an arrangement of a calibration system according to the present invention relative to a printhead.

As shown in FIG. 4, the printhead 500 is moved to one side of the vacuum imaging drum 300. In order to calibrate the laser diodes 402, the translation stage member 220 moves the printhead 500 outside the normal imaging area so that it is approximately aligned with the ceramic attenuator 410. Calibration control logic then causes the laser diode 402 to radiate energy to the ceramic attenuator 410. The calibration control logic then modulates power for the laser diode 402 based on the feedback signal 415 from the calibration sensor 422. One method of calibrating a laser is disclosed in U.S. Pat. No. 5,266,973, incorporated herein by reference.

The ceramic material used to manufacture the ceramic attenuator 410 operates by diffusing the radiation that it receives at an input face 416. The amount of attenuation that the ceramic attenuator 410 achieves has been found to be a function of a number of characteristics, including the type of ceramic used, its porosity, purity and the dimensions of the ceramic attenuator. Porosity is a function of the material composition and the method of manufacture. In the preferred embodiment, the porosity of the ceramic attenuator 410 is 1%. Depending on the characteristics of the ceramic material, other porosities may be appropriate, preferably in the range of 1% to 8%.

By varying the composition of the ceramic attenuator 410, which can be doped with other substances to achieve different diffraction and diffusion levels, and by manipulating the ceramic's structure, it is possible to fabricate the ceramic attenuator 410 to suit the characteristics of the writing laser diode 402. The composition of the ceramic attenuator 410 may also be varied to match the characteristics of the calibration sensor. In the preferred embodiment, the composition of the ceramic attenuator material is magnesium oxide (MgO).

The ceramic attenuator 410 has an input face 416 and output face 418, both of which are porous. The sides of ceramic attenuator 410 are sealed, in the preferred embodiment, by burnishing. The burnished sides tend to reflect laser energy. The characteristics described above work well with a laser having a wavelength approximately 800 nm. A mounting device, such as a tube, can be used to hold the ceramic attenuator 410. The tube is an alternate means to seal the sides and control attenuation characteristics. A number of other options are also suitable for sealing the ceramic attenuator, such as encasement of the ceramic material with an external coating, or a jacket of other materials.

The dimensions of the ceramic attenuator 410 also determine how much radiant energy is delivered from its input face 416 to its output face 418. Varying the length of a ceramic attenuator 410 along an axis of the light beam, for example, is another means of adjusting the attenuation characteristics. In an experimental embodiment of the present invention, the length of ceramic attenuator 410 along an axis of the light beam was 20 mm. This provided suitable attenuation for lasers having a power output of 200 mW to 800 mW. The electrical and heat insulating properties of ceramics allowed the ceramic attenuator 410 to be affixed directly to the photodiode sensor 422. The ceramic attenuator could also be spaced at a predetermined distance from the photodiode sensor 422.

The position of the printhead 500 relative to the position of the ceramic attenuator 410 and photodiode sensor 422 can be varied when using a calibration filter according to the present invention. In one embodiment, the printhead is focused directly on the photodiode sensor 422 surface. In another embodiment, the focus is offset to achieve a predetermined photodiode sensor 422 response level when attenuated by the ceramic attenuator 410. The ceramic attenuator 410 scatters the radiant energy so that the spot size of the imaging laser signal at its input face 416 can be measured over a much wider area at its output face 418. For example, a laser diode 402 signal with 10 micron spot size can be detected at the output face 418 of ceramic attenuator 410 over an area having approximately 1 mm radius. Thus, alignment of the printhead with the calibration system is not critical.

The laser calibration subsystem 420 can be situated at a separate location on the side of the vacuum imaging drum 300 as depicted in FIG. 4. In an alternate embodiment, the laser calibration subsystem 420 and its components are mounted as part of the vacuum imaging drum 300. This requires mounting the ceramic attenuator 410 on the inside of the vacuum imaging drum 300.

Figure 5:
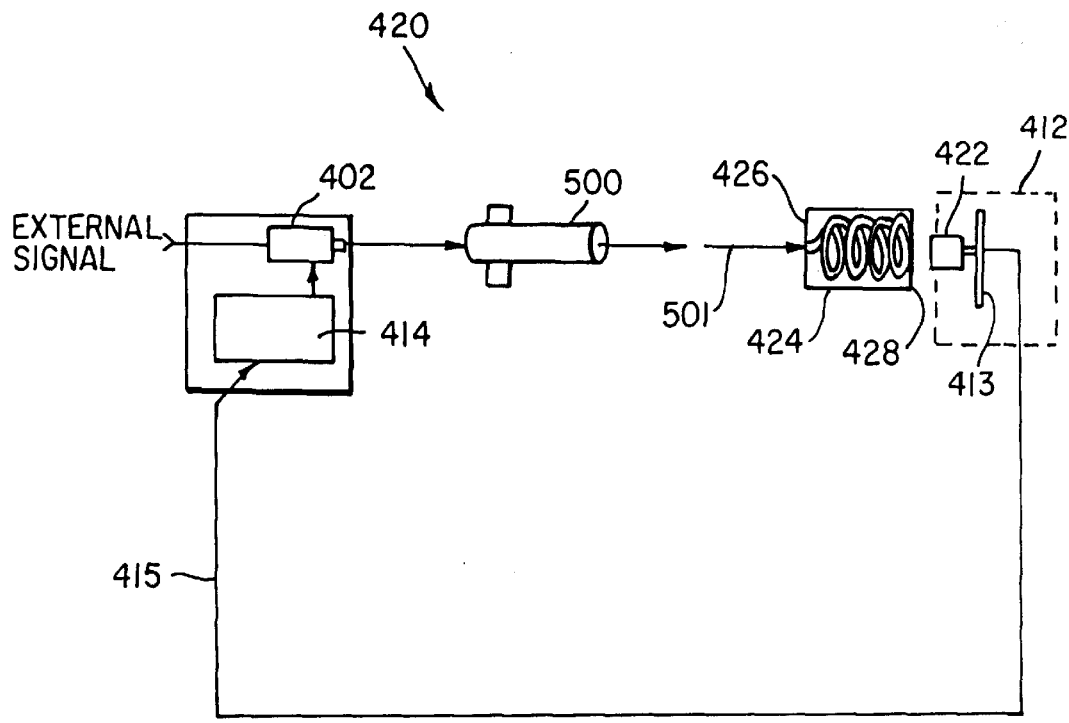
FIG. 5 is a block diagram of a calibration system according to the present invention with a spiral chamber ceramic attenuator.

Referring to FIG. 5, a block diagram of an alternate laser calibration subsystem 420 is shown. Each individual laser 402 transmits a signal to the sensing components focused by the printhead 500 as in the previous embodiment, and a spiral chamber ceramic attenuator 424 attenuates and mixes the light that reaches the calibration sensor 412. The photodiode sensor 422 feedback signal is transmitted to laser driver control circuitry 414, which sets the input power level for each laser diode 402.

The spiral chamber ceramic attenuator 424 operates by diffusing the radiation that it receives at a chamber input port 426. The amount of attenuation that the spiral chamber ceramic attenuator 424 achieves has been found to be a function of a number of characteristics, including the type of ceramic used and the geometry of the spiral chamber. Light leaving output port 428 need not be precisely aligned with optical axis 501 for accurate measurement. Factors affecting the geometry of the spiral chamber include the overall length of the chamber, inner diameter of the hollow chamber, spiral radius, and the number of turns the spiral makes. The chamber walls are glazed in the preferred embodiment to exhibit specific reflectivity to the incident laser radiation. The spiral shape itself can also be varied, allowing tapering of the spiral toward either the chamber input port 426 or the chamber output port 428.

By manipulating any of these variables, it is possible to fabricate a spiral chamber ceramic attenuator 424 that is particularly suited to a specific characteristic of the writing laser diode 402, for example, wavelength, and those of the sensing components used in the image processing apparatus 10. In an experimental apparatus to test the concept, a ceramic attenuator ½ inch thick was prepared with a spiral chamber which made one and a half turns through the thickness of the attenuator. The diameter of the chamber was approximately ⅛ inch. The diameter of a cylinder defined by the spiral was approximately ¼ inch. There was no direct light path between the front of the attenuator and the back of the attenuator.

The ceramic attenuator was prepared as follows. The spiral chamber was created by forming the ceramic substrate about a metal spring, such that when the ceramic substrate was fired at high temperatures, the metal vaporized, leaving a hollow spiral tube inside a ceramic core. The composition of the ceramic was aluminum oxide ($Al_2O_3$). This method of fabrication allows the use of different types of metals and other materials that glaze the inside of the spiral chamber ceramic attenuator 424 as the ceramic is fired, giving the inner chamber walls specific reflectivity characteristics.

Figure 6:
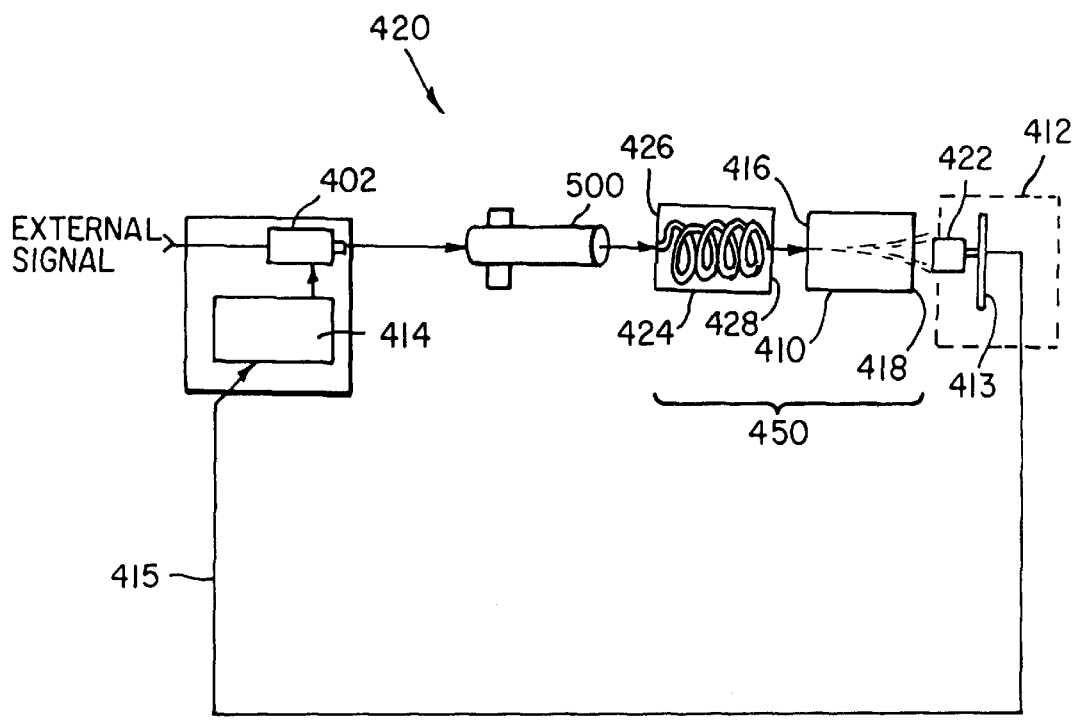
FIG. 6 is a block diagram of a calibration system according to the present invention with a ceramic calibration filter comprised of a ceramic attenuator and a spiral chamber ceramic attenuator.
Figure 7:
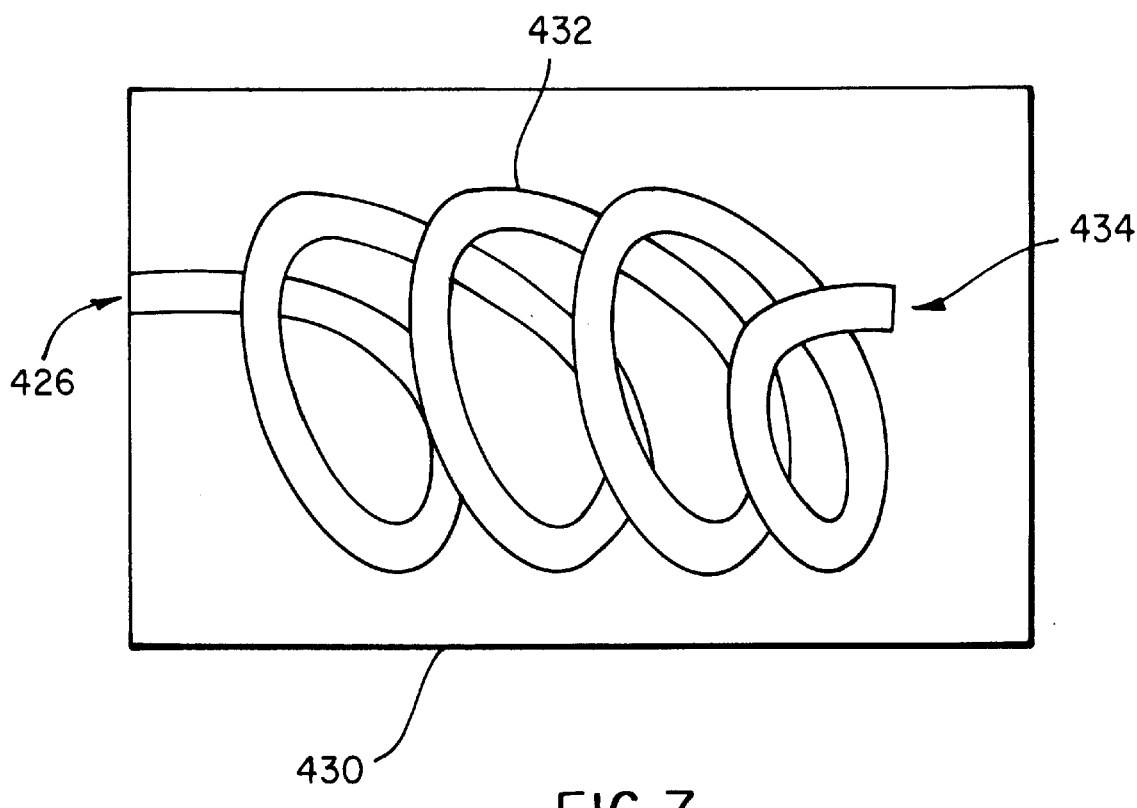
FIG. 7 is a side view, partially in phantom, showing a combined attenuator.

FIG. 6 shows an alternate embodiment wherein calibration filter 450 is comprised of a spiral chamber attenuator 424 located between ceramic attenuator 410 and printhead 500. In this embodiment, the mixing capabilities of spiral chamber attenuator 424 are combined with the attenuating capabilities of ceramic attenuator 410. A combined attenuator 430 is shown in FIG. 7.

Although not described in detail, it would be obvious to someone skilled in the art that this invention can have broad application to laser imaging devices of all kinds, including film-writers, digital proofing systems, imagesetting devices and plate-writers. This invention can also be used in any device using a laser where laser power must be reliably and predictably attenuated for accurate measurement.

The invention has been described with reference to the preferred embodiment thereof. However, it will be appreciated and understood that variations and modifications can be effected within the scope of the invention as described herein and as defined in the appended claims by a person of ordinary skill in the art without departing from the scope of the invention. For example, the invention is applicable to any laser apparatus wherein it is useful to measure laser power level. Additionally, groups of lasers can be calibrated, rather than calibrating each individual laser separately.

PARTS LIST

10. Image processing apparatus
12. Image processor housing
14. Image processor door
16. Donor ejection chute
18. Donor waste bin
20. Media stop
30. Roll media
32. Thermal print media
34. Dye donor roll material
36. Dye donor sheet material
50. Sheet material trays
50a. Lower sheet material tray
50. Upper sheet material tray
52. Media lift cams
52a. Lower media lift cam
52b. Upper media lift cam
54. Media rollers
54a. Lower media roller
54b. Upper media roller
56. Media guide
58. Media guide rollers
60. Media staging tray
80. Transport mechanism
100. Media carousel
110. Media drive mechanism
112. Media drive rollers
120. Media knife assembly
122. Media knife blades
180. Color binding assembly
182. Media entrance door
184. Media exit door
200. Lathe bed scanning subsystem
202. Lathe bed scanning frame
204. Entrance passageway
206. Rear translation bearing rod
208. Front translation bearing rod
220. Translation stage member
250. Lead screw
252. Threaded shaft
254. Lead screw drive nut
256. Drive coupling
258. Linear drive motor
300. Vacuum imaging drum
400. Laser assembly
402. Laser diodes
404. Fiber optic cables
406. Distribution block
410. Ceramic attenuator
412. Calibration sensor
413. PC Board
414. Laser driver control circuitry
415. Feedback signal
416. Input face
418. Output face
420. Laser calibration subsystem
422. Photodiode sensor
426. Input port
428. Output port
430. Combined filter
432. Spiral chamber
434. Blind hole
450. Calibration filter
500. Printhead
501. Optical axis

What is claimed is:

1. A ceramic calibration filter for attenuating radiation between a light source and a sensor comprising:
    a ceramic attenuator located between said light source and said sensor; and
    wherein said ceramic attenuator has a porosity in the range of 1% to 8%.

2. A ceramic calibration filter as in claim 1 wherein said ceramic attenuator has a porosity of 1%.

3. A ceramic calibration filter as in claim 1 wherein said ceramic attenuator has sealed sides.

4. A ceramic calibration filter as in claim 3 wherein said sides are sealed by burnishing.

5. A ceramic calibration filter as in claim 1 wherein said ceramic attenuator is comprised of material selected from a group comprised of magnesium oxide (MgO) and aluminum oxide ($Al_2O_3$).

6. A ceramic calibration filter for attenuating radiation between a light source and a sensor comprising:
    a ceramic attenuator located between said light source and said sensor; and
    having a spiral chamber, an axis of which is oriented approximately parallel to an optical axis of said light source.

7. A ceramic calibration filter as in claim 6 wherein said spiral chamber makes at least one half turn through a thickness of said ceramic attenuator.

8. A ceramic calibration filter for attenuating radiation between a light source and a sensor comprising:
    a ceramic attenuator located between said light source and said sensor; and
    a spiral chamber ceramic attenuator located between said ceramic attenuator and said light source.

9. A ceramic calibration filter for attenuating radiation between a light source and a sensor comprising a combined attenuator comprised of a ceramic material having a spiral chamber extending partially through said ceramic material.

10. A ceramic calibration filter as in claim 9 wherein an axis of said spiral chamber is approximately aligned with an optical axis of said light source.

* * * * *